(12) United States Patent
Takeda et al.

(10) Patent No.: US 9,669,567 B2
(45) Date of Patent: Jun. 6, 2017

(54) MANUFACTURING METHOD OF MOLDED ARTICLE

(71) Applicant: PANASONIC CORPORATION, Osaka (JP)

(72) Inventors: Tsuyoshi Takeda, Osaka (JP); Hiromitsu Takashita, Osaka (JP); Keiko Kashihara, Osaka (JP); Shingo Yoshioka, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 380 days.

(21) Appl. No.: 14/446,660

(22) Filed: Jul. 30, 2014

(65) Prior Publication Data

US 2015/0035202 A1    Feb. 5, 2015

(30) Foreign Application Priority Data

Aug. 1, 2013  (JP) .................................. 2013-160214

(51) Int. Cl.
*H01L 21/768* (2006.01)
*B29C 41/20* (2006.01)
(Continued)

(52) U.S. Cl.
CPC .............. *B29C 41/20* (2013.01); *B32B 37/12* (2013.01); *H01L 21/561* (2013.01); *H01L 24/19* (2013.01); *H01L 24/96* (2013.01); *H01L 24/97* (2013.01); *B29C 39/10* (2013.01); *B29K 2101/00* (2013.01); *H01L 21/568* (2013.01); *H01L 23/3128* (2013.01); *H01L 2224/04105* (2013.01); *H01L 2224/12105* (2013.01);

(Continued)

(58) Field of Classification Search
CPC ..................................................... H01L 21/568
See application file for complete search history.

(56) References Cited

U.S. PATENT DOCUMENTS

| | | | | |
|---|---|---|---|---|
| 2006/0183269 A1* | 8/2006 | Fuergut | ................. | H01L 21/568 438/106 |
| 2010/0252185 A1* | 10/2010 | Kiuchi | ................... | C09J 7/0296 156/247 |
| 2012/0146177 A1* | 6/2012 | Choi | ....................... | H01L 25/16 257/528 |

FOREIGN PATENT DOCUMENTS

| | | |
|---|---|---|
| JP | 2010-283097 | 12/2010 |
| JP | 2010-287836 | 12/2010 |

* cited by examiner

*Primary Examiner* — Galen Hauth
(74) *Attorney, Agent, or Firm* — Greenblum & Bernstein, P.L.C.

(57) ABSTRACT

The present invention relates to a manufacturing method of a molded article, including: a molded article forming step of forming a molded article by curing a resin composition on a main surface, on the side of a bendable first supporting medium, of a laminated supporting medium obtained by laminating the first supporting medium and a second supporting medium that is harder than the first supporting medium; a second-supporting medium peeling step of peeling the second supporting medium from the first supporting medium after the molded article forming step; and a first-supporting medium peeling step of peeling the first supporting medium from the molded article while bending the first supporting medium after the second-supporting medium peeling step. The shape of the first supporting medium can be maintained at a curing temperature at which the resin composition is cured in the molded article forming step.

5 Claims, 4 Drawing Sheets

(51) Int. Cl.
  *B32B 37/12* (2006.01)
  *H01L 23/00* (2006.01)
  *B29K 101/00* (2006.01)
  *B29C 39/10* (2006.01)
  *H01L 21/56* (2006.01)
  *H01L 23/31* (2006.01)
(52) U.S. Cl.
  CPC ............... *H01L 2924/12042* (2013.01); *H01L 2924/3511* (2013.01)

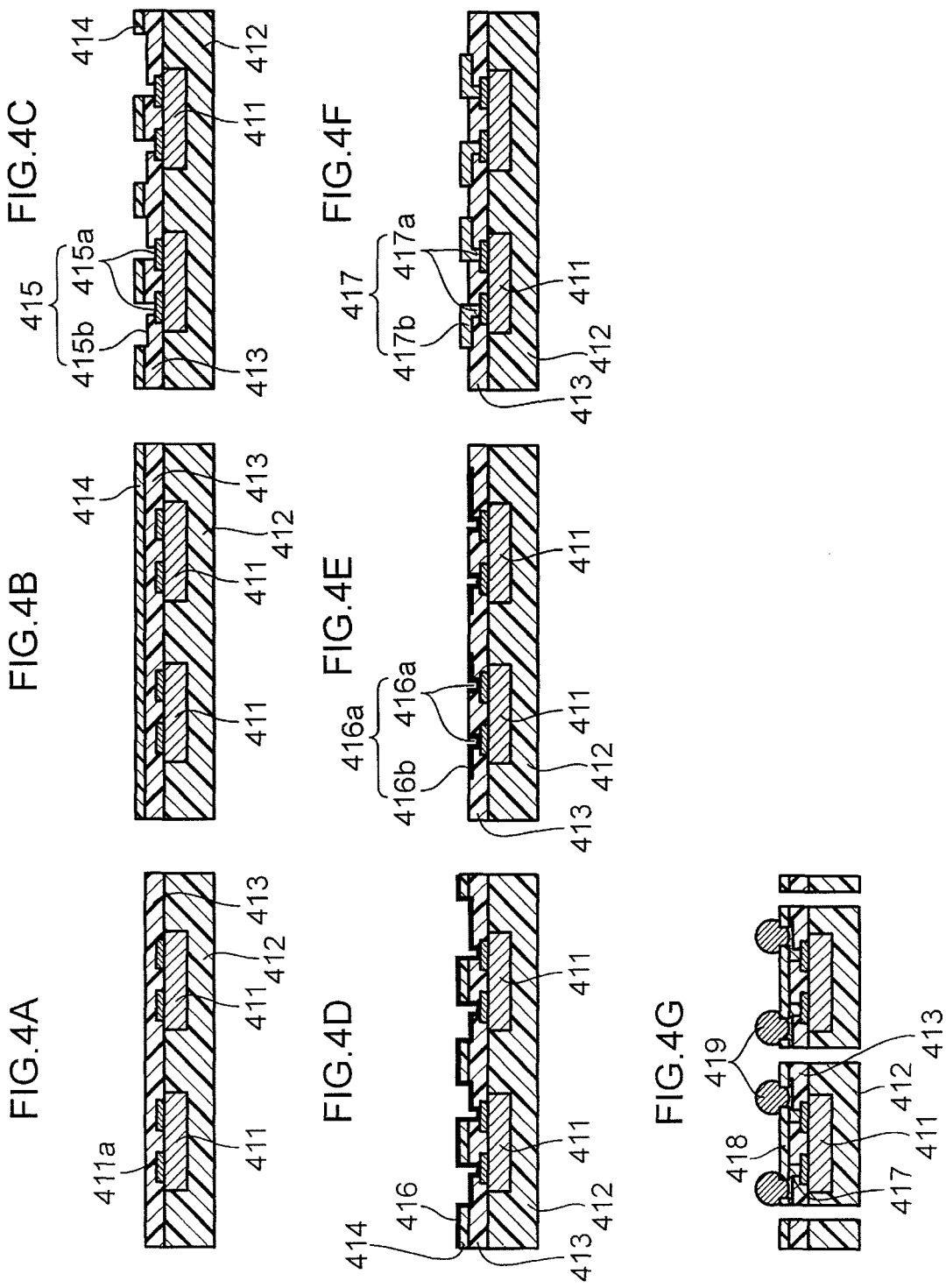

MANUFACTURING METHOD OF MOLDED ARTICLE

CROSS-REFERENCE TO RELATED APPLICATIONS

This application claims the benefit of Japanese Application No. 2013-160214 filed Aug. 1, 2013, which is incorporated herein by reference in its entirety.

FIELD OF THE INVENTION

The present invention relates to a manufacturing method of a molded article.

BACKGROUND OF THE INVENTION

In a method of manufacturing a molded article by curing a resin composition, a molded article in a desired shape is required to be obtained, by sufficiently suppressing warpage and the like that occur at the time of curing the resin composition. When a molded article to be manufactured has a relatively large area, that is, when the ratio of the area to the thickness is relatively large, there is a tendency that the occurrence of warpage becomes noticeable. Therefore, a method in which, even when a molded article of a relatively large area is to be manufactured, the occurrence of warpage can be sufficiently suppressed when curing a resin composition, is required. Specifically, when manufacturing the following semiconductor package, the above-described method of manufacturing a molded article, the warpage of which is suppressed, has come to be required.

As semiconductor packages, ball grid arrays (BGA) of a wire bond type and a flip chip type are being used. On the other hand, in order to solve new problems that occur associated with quality improvement of electronic devices, further quality improvement such as high-density wiring, high functionalization, downsizing and thinning, and high speed while suppressing the excessive increase in cost is required for semiconductor packages that are used in electronic devices. Specifically, the wire bond type BGA, for example, has problems in high cost because of use of metal wires, difficulty in miniaturization, reduction in reliability due to wire sweep, etc. The flip chip type BGA has a shorter connection distance between the electrode of a semiconductor chip and the circuit of a substrate as compared with the wire bond type, and therefore, has advantages in that the electric characteristic is satisfactory and the package can be made compact. However, even in the case of the flip chip type BGA, multiple pinning (multiple I/O) following the miniaturization is required to satisfy the above further requirements. Consequently, further miniaturization of a solder bump and cost increase in corresponding interposers have become problems.

As a new mode of a semiconductor package that is manufactured without using a wire bond, a solder bump, or interposers, there has been proposed a wafer level package (WLP) of carrying out packaging while still part of the wafer. As an example of a WLP, a wafer level chip size package (WL-CSP) is available.

The WL-CSP is a package obtained by performing not only electrode forming but also resin sealing and the like and finally by cutting to provide chips, in a wafer process. Because the size of the WL-CSP finally obtained by cutting a wafer directly becomes a size of the package, the WL-CSP can be said to be ideal from the viewpoint of downsizing and weight reduction. However, according to the WL-CSP, because the package size is determined by the size of the semiconductor chip, there is a limit to the increase in the number of I/O.

Therefore, a fan-out type WLP (fan-out WLP: FOWLP) has been proposed. In order to satisfy the multiple pinning (multiple I/O) requirement, the FOWLP is a package obtained by arranging a plurality of individual semiconductor chips on a supporting medium which is removed later, and by performing resin sealing and subsequent cutting of the semiconductor chips. Therefore, as resin sealing methods when manufacturing the FOWLP, for example, there is a method of covering a supporting medium on which a plurality of semiconductor chips are mounted, using a resin composition as a sealing material, and curing the resin composition. In the case of this method, the area of covering the semiconductor chips with the resin composition becomes relatively large. When the resin composition of such a relatively large area was cured, there was a tendency that warpage and the like easily occurred, as described above. Therefore, as resin sealing methods when manufacturing the FOWLP, there has been demanded a method of obtaining a molded article in which the occurrence of warpage and the like when curing the resin composition is sufficiently suppressed even when the molded article has a relatively large area. When the area of an obtained molded article becomes large, a contact area between the supporting medium and the molded article becomes large, and therefore, there has also been a problem in that peeling of the molded article from the supporting medium becomes difficult.

As a method of manufacturing such a semiconductor package, there is one described in US Patent Application Publication No. 2006/0183269 (hereinafter Patent Document 1).

Patent Document 1 describes a method using a temperature sensitive adhesive which loses adhesion performance at or above a predetermined temperature. Specifically, the described manufacturing method of a semiconductor package includes arranging a plurality of semiconductor chips at a temperature sensitive adhesive side, of a supporting medium having the temperature sensitive adhesive on the surface, embedding the arranged semiconductor chips with a plastic material, thereafter heating the embedded semiconductor chips at or above a predetermined temperature to lose adhesion performance of the temperature sensitive adhesive, and peeling the supporting medium.

According to studies by the present inventors, when manufacturing a molded article including a cured product of a resin composition on the supporting to be finally peeled, there has been a problem in that the supporting medium is hard and cannot be bent. That is, when what is called a rigid substrate is used, after the molded article is formed on the supporting medium, at the time of peeling the molded article from the supporting medium, the molded article is damaged, and the molded article in a desired shape cannot be obtained. Further, there is a problem in that when the molded article contains semiconductor chips, stress is applied to the semiconductor chips themselves at the peeling time, so that the semiconductor chips are damaged and a crack occurs due to stress applied to the semiconductor chips and the resin interface.

When what is called a bendable flexible substrate is used as a supporting medium, there has been a case where warpage that occurs at the time of curing a resin composition cannot be sufficiently suppressed, on the supporting medium. That is, there has been a case where the obtained molded article was a warped product. When semiconductor chips are contained in the molded article, there is also a problem in that stress is applied to the semiconductor chips and the resin interface and a crack occurs due to warpage.

Such a damage to the semiconductor chips becomes a cause of that the semiconductor chips subsequently do not correctly function as electronic parts. On the other hand, a crack on the semiconductor chips and the resin interface can become a cause of that an insulation resin layer cannot be uniformly formed at the time of forming the insulation resin layer on the semiconductor chip circuit surface to form an electric wiring later, and that molding performance of the electric wiring is aggravated.

According to the method described in Patent Document 1, when a rigid substrate is used as a supporting medium, the occurrence of warpage can be suppressed, and the adhesion performance is lost by heating. Therefore, the problem at the peeling time is not considered to easily occur.

However, at the time of curing the resin composition to be used to seal the semiconductor chips, there is a risk that the adhesion performance of the temperature sensitive adhesive becomes low. Further, in order to suppress the reduction in the adhesion performance of the temperature sensitive adhesive, the resin composition needs to be cured at a temperature lower by a certain level than a temperature at which the adhesion performance of the temperature sensitive adhesive becomes low. Therefore, there has been a problem in that material selectivity of the resin composition to be used to seal the semiconductor chips became low. Further, according to the method described in Patent Document 1, after the resin was cured, the resin was necessary to be heated to a temperature at which the adhesion performance of the temperature sensitive adhesive became low. That is, there is a problem in that the number of processes becomes large because the heating process needs to be executed at two times. Further, when an adhesive having no temperature sensitivity was used, there has been a problem in that the molded article was damaged at the time of peeling the molded article from the supporting medium.

The present invention has been made in view of the above circumstance. An object of the invention is to provide a manufacturing method of a molded article capable of manufacturing a molded article in a desired shape, by reducing problems of selectivity of a resin composition, by suppressing warpage of a resin molded article without giving a damage to the resin molded article and contained substances such as semiconductor chips and electronic parts, even in the case of manufacturing a molded article having a large area.

SUMMARY OF THE INVENTION

A manufacturing method of a molded article according to one aspect of the present invention includes:

forming a molded article by curing a resin composition on a main surface, on a side of a bendable first supporting medium, of a laminated supporting medium obtained by laminating the first supporting medium and a second supporting medium that is harder than the first supporting medium;

peeling the second supporting medium from the first supporting medium after the molded article forming step; and peeling the first supporting medium from the molded article while bending the first supporting medium after peeling the second-supporting medium.

BRIEF DESCRIPTION OF THE DRAWINGS

FIGS. 4A to 4G are views showing an example of a manufacturing method of a semiconductor package according to the embodiment of the present invention.

DETAILED DESCRIPTION OF THE INVENTION

Figure 1A:
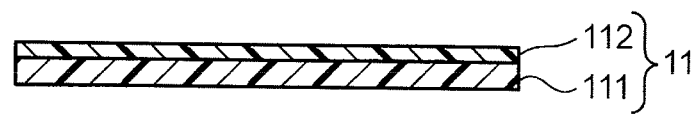
FIGS. 1A to 1D are views (part one) for explaining an example of a manufacturing method of a molded article according to an embodiment of the present invention.

Hereinafter, while an embodiment of the present invention will be described, the present invention is not limited to this embodiment.

A manufacturing method of a molded article according to the present embodiment first includes a molded article forming process of forming a molded article by curing a resin composition on a main surface at a first supporting medium side, of a laminated supporting medium formed by laminating the first supporting medium which is bendable and a second supporting medium which is harder than the first supporting medium.

In this way, because the molded article is formed by curing the resin composition on the laminated supporting medium which includes the laminated second supporting medium, the occurrence of warpage and the like is considered to be suppressed, as compared with the case of forming the molded article on the supporting medium which is made of the bendable first supporting medium. Therefore, the obtained molded article is considered to have a shape nearer to a desired shape.

For the resin composition to be used in this case, a resin curing temperature is preferably 150° C. or above, more preferably 175° C. or above, and most preferably 200° C. or above. By using the resin composition of a high curing temperature, a crosslink density can be increased. As a result, effects of, for example, improvement in strength of the molded article and a reduction in a moisture absorption rate can be obtained.

Further, the manufacturing method of a molded article according to the present embodiment includes a second-supporting medium peeling process of peeling the second supporting medium from the first supporting medium after the molded article forming process.

Peeling the second supporting medium which is harder than the first supporting medium has a risk of damaging the first supporting medium such as hurting the first supporting medium. However, because the molded article formed by the molded article forming process and the second supporting medium are present via the first supporting medium, it is considered possible to sufficiently suppress the damage to the molded article even when the second supporting medium is peeled and even when the first supporting medium is damaged. Further, even when the area in which a damage is considered to easily occur is large, the damage that occurs at the peeling time is considered to occur in the first supporting medium rather than in the molded article.

Further, the manufacturing method of a molded article according to the present embodiment includes a first-supporting medium peeling process of peeling the first supporting medium from the molded article while bending the first supporting medium after the second-supporting medium peeling process.

When the first supporting medium is peeled from the molded article while bending the first supporting medium, it is considered possible to perform the peeling while reducing a load applied to the molded article. Therefore, even when the area of the molded article is large, it is considered possible to sufficiently suppress the occurrence of a damage to the molded article at the time of peeling the first supporting medium.

As a result, it is possible to provide a manufacturing method of a molded article capable of manufacturing a molded article in a desired shape, even in the case of manufacturing a molded article having a large area.

Further, the manufacturing method of a molded article according to the present embodiment uses a bendable supporting medium softer than the second supporting medium, as the first supporting medium. The first supporting medium is preferably capable of maintaining its shape at a curing temperature at which the resin composition is cured in the molded article forming process. A bendable supporting medium tends to be deformed by heat and the like. However, by using the first supporting medium, it is considered possible to sufficiently suppress the occurrence of shape abnormality in the molded article due to the deformation of the first supporting medium at the curing time of the resin composition.

From the above, the manufacturing method of a molded article according to the present embodiment is considered to be able to manufacture a molded article in a desired shape, even in the case of manufacturing a molded article having a large area.

There is no particular limit to the molded article so far as the molded article can be obtained by curing a resin composition. For example, there is a molded article that is made of only a cured product of a resin composition. In this case, the molded article forming process may be a process of curing a resin composition on the laminated supporting medium so that a molded article in a desired shape is obtained. As the molded article, there is also a molded article that contains elements such as semiconductor chips and electronic parts, that is, a semiconductor package, for example. In this case, the molded article forming process is a manufacturing method that includes the following processes, for example.

The molded article forming process includes a laminating process of laminating a semiconductor chip on the main surface of the laminated supporting medium, a process of covering the semiconductor chip with the resin composition, and a process of curing the resin composition. When these processes are used as the molded article forming process, a molded article that contains semiconductor chips can be formed in a desired shape, by the manufacturing method of a molded article according to the present embodiment. That is, a suitable semiconductor package can be obtained. In the laminating process, the semiconductor chip may be mounted so that an electrode surface on which an electrode of the semiconductor chip is formed is in contact with the first supporting medium of the laminated supporting medium, or the semiconductor chip may be mounted so that a rear surface of the electrode surface is in contact with the first supporting medium of the laminated supporting medium. When the semiconductor chip is mounted so that the electrode surface is in contact with the first supporting medium of the laminated supporting medium, a molded article having an exposed electrode can be obtained.

Further, as the first supporting medium, there is one that includes a first base material and a first adhesive layer that is formed on the first base material as describe later. By using the supporting medium that includes the first adhesive layer, it is considered possible to peel the second supporting medium from the laminated supporting medium by keeping on the laminated supporting medium the molded article that is formed on the first supporting medium of the laminated supporting medium by a method described later. Preferably, the first adhesive layer has weaker adhesion strength to the molded article than adhesion strength to the first base material. When the first adhesive layer has this adhesion strength, the first supporting medium can be easily peeled from the molded article. At the time of peeling the first supporting medium from the molded article, the first supporting medium can be peeled in a state that the first adhesive layer is kept formed at a first base material side of the first supporting medium, and movement of the first adhesive layer to the molded article side can be sufficiently suppressed. From these facts, because peeling of the second supporting medium and peeling of the first supporting medium can be suitably performed, the damage to the shape of the molded article can be suppressed, and it is considered possible to manufacture a molded article in a more suitable shape.

As the second supporting medium, there is one that includes a second base material and a second adhesive layer which is formed on the second base material. By using the supporting medium that includes the first adhesive layer, at the time of forming a molded article on the first supporting medium, peeling or deviation of the second supporting medium from the first supporting medium can be suppressed. Therefore, the molded article can be suitably manufactured. Preferably, the second adhesive layer has weaker adhesion strength to the first supporting medium than adhesion strength to the second base material. When the second adhesive layer has this adhesion strength, the second supporting medium can be easily peeled from the first supporting medium. At the time of peeling the second supporting medium from the first supporting medium, the second supporting medium can be peeled in a state that the second adhesive layer is kept formed at the second base material side of the second supporting medium, and it is considered possible to sufficiently suppress the movement of the second adhesive layer to the first supporting medium side. From these facts, because peeling of the second supporting medium can be suitably performed, it is considered possible to manufacture a molded article in a more suitable shape.

Hereinafter, an example of the manufacturing method of a molded article according to the present embodiment will be described. Specifically, an example of a manufacturing method of a semiconductor package will be described. FIGS. 1A to 1D and FIGS. 2A to 2D are views for explaining an example of the manufacturing method of a molded article according to the embodiment of the present invention.

First, as shown in FIG. 1A, a first supporting medium 11 is prepared. The first supporting medium 11 is not particularly limited, so far as the first supporting medium 11 is a bendable supporting medium that is softer than a second supporting medium described later and that can maintain a shape at a curing temperature at which a resin composition is cured in a molded article forming process. That is, the first supporting medium 11 is a heat-resistant and relatively flexible supporting medium. As the first supporting medium 11, there is a first supporting medium 11 that includes a first base material 111, and a first adhesive layer 112 that is formed on the first base material 111, as shown in FIG. 1A. Preferably, the first adhesive layer 112 has weaker adhesion strength to a molded article which is formed on the surface of the first adhesive layer 112 than adhesion strength to the first base material 111. A method of obtaining the first supporting medium 11 is not particularly limited, so far as the method satisfies the above relationship of adhesion strength. Specifically, there is a method of forming the first adhesive layer 112 on the first base material 111, after a processing of increasing adhesion strength to the first adhesive layer 112 is executed in advance to a surface of the first base material 111 on which the first adhesive layer 112 is formed. As a processing of increasing the adhesion strength, there is a roughening processing, for example.

The first supporting medium 11 is at first bendable, as described above. The "bendable" means that the first supporting medium 11 can be wound in a roll shape, for example, and that the first supporting medium 11 has a certain level of flexibility capable of sufficiently suppressing a damage even after being wound in a roll shape. Preferably, the first supporting medium 11 can be wound around a cylindrical body having a radius of 5 mm, at a winding angle of 180°. Specifically, it is preferable that a damage such as a crease and a crack does not occur in the first supporting medium 11 even after the first supporting medium 11 is wound around an iron cylindrical body (an iron core) having a radius of 5 mm, at a winding angle of 180°. When the first supporting medium has the above flexibility, it is considered possible to suitably peel the first supporting medium while bending the first supporting medium. Further, the first supporting medium 11 has heat resistance capable of maintaining its shape, at a curing temperature of a resin composition at the time of forming the molded article, as described above. For example, it is preferable that the first base material of the first supporting medium is a resin film having no melting point or a resin film having a melting point of 150° C. or above. As a resin film having no melting point, a thermosetting polyimide film having no melting point is preferable. In the case of a resin film having a melting point, the melting point is preferably 150° C. or above, more preferably 200° C. or above. While a higher melting point is preferable, a resin film (a plastic film) that has a high melting point is generally known to have a melting point of about 335° C. Therefore, it is general that an upper limit value of a melting point is about 335° C. That is, it is preferable that the melting point of a resin film is from 150° C. to 335° C. The first supporting medium having the first base material like this can achieve better shape maintenance at a curing temperature at which the resin composition is cured in the molded article forming process. By using the first supporting medium like this, it is considered possible to more suppress the occurrence of shape abnormality of the molded article due to deformation of the first supporting medium at the curing time of the resin composition. The first supporting medium having the above first base material is considered to be able to sufficiently suppress the occurrence of warpage by being bonded to the second supporting medium even when the first base material has a small thickness. From these facts, by using the first supporting medium having the above first base material, it is considered possible to manufacture a molded article in a more suitable shape. A melting point in this case can be measured by a known method. The melting point can be measured by the differential scanning calorimetry (DSC), for example.

The first base material 111 and the first adhesive layer 112 are not particularly limited, so far as the first base material 111 and the first adhesive layer 112 can become the first supporting medium 11. A thickness and a material of the first base material 111 are not limited, so far as the base material satisfies bendability and heat resistance of the first supporting medium 11. The first base material 111 may be a plastic film or a metal foil, for example, and is preferably a plastic material from the viewpoint of cost and easiness of handling. As the plastic film, there are a polyimide film, a polyethylene terephthalate (PET) film, and the like. A thickness of the first base material 111 is not particularly limited, and is preferably 25 µm to 300 µm, for example. A thickness and a material of the first adhesive layer 112 are not particularly limited, so far as the first adhesive layer 112 is a layer to the surface of which the molded article can be adhered, and the adhesive layer satisfies the bendability and the heat resistance of the first supporting medium 11. The first adhesive layer 112 is not particularly limited, so far as the layer is the adhesive layer as described above, and can be a layer made of an adhesive, for example. As the adhesive, there are a silicone adhesive, an acrylic adhesive, a rubber adhesive, and a urethane adhesive, for example. Among these adhesives, the silicone adhesive and the acrylic adhesive are preferable, from the viewpoint of heat resistance. A heat resistance temperature of the adhesive is preferably 150° C. or above, more preferably 175° C. or above, and most preferably 200° C. or above. The heat resistance temperature in this case means a temperature at which appearance abnormality such as wrinkling, foaming, and discoloration does not occur in the appearance test after the base material coated with an adhesive (adhesive-coated film) is left for 30 minutes in a dryer that is set at a predetermined temperature. As the adhesive of the first adhesive layer 112, an ultraviolet curing type and a pressure sensitive type can be used, and the pressure sensitive type is preferable from the viewpoint of process simplification.

Figure 1B:
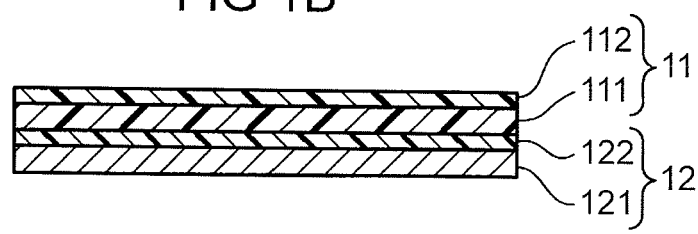

Next, a second supporting medium 12 is prepared, and the first supporting medium 11 is laminated on the second supporting medium 12, as shown in FIG. 1B. Specifically, the first base material 111 of the first supporting medium 11 is laminated on the second supporting medium 12 so as to be in contact with the second supporting medium 12. Further, a second adhesive layer 122 of the second supporting medium 12 is laminated on the first supporting medium 11 so as to be in contact with the first supporting medium 11. With this arrangement, a laminated supporting medium is provided by laminating the first supporting medium 11 on the second supporting medium 12.

The second supporting medium 12 is not particularly limited, so far as the second supporting medium 12 is a supporting medium that is harder than the first supporting medium 11. Specifically, the second supporting medium 12 may be a supporting medium having the following hardness. The second supporting medium 12 may be the one that configures the laminated supporting medium, together with the first supporting medium 11, and that has hardness capable of sufficiently suppressing the occurrence of an inconvenience such as warpage of an obtained molded article, due to flexure and the like of the laminated supporting medium, at the time of obtaining the molded article by curing the resin composition on the laminated supporting medium. Preferably, the second supporting medium 12 is a supporting medium capable of maintaining its shape, at a curing temperature at which the resin composition is cured in the molded article forming process, in a similar manner to that of the first supporting medium 11. That is, the second supporting medium 12 is a rigid supporting medium, and has preferably high heat resistance. As the second supporting medium 12, there is one that includes a second base material 121 and the second adhesive layer 122 which is formed on the second base material 121, as shown in FIG. 1B. Preferably, the second adhesive layer 122 has weaker adhesion strength to the first supporting medium 11 than adhesion strength to the second base material 121. A method of obtaining the second supporting medium 12 is not particularly limited, so far as the method satisfies the above relationship of adhesion strength. Specifically, there is a method of forming the second adhesive layer 122 on the second base material 121, after a processing of increasing adhesion strength to the second adhesive layer 122 is executed in advance to a surface of the second base material 121 on which the second adhesive layer 122 is formed. As a processing of increasing the adhesion strength, there is a roughening processing, for example.

Preferably, as described above, the second supporting medium 12 is, first of all, harder than the first supporting medium 11, and can sufficiently suppress the occurrence of flexure and the like when a laminated supporting medium has been configured, together with the first supporting medium 11. At the time of manufacturing the molded article, carrying performance after forming the molded article can be increased, for example. Specifically, the second supporting medium 12 has a Young's modulus of preferably 20 GPa or above, more preferably 50 GP or above, and most preferably 100 GPa or above. In this case, Young's modulus is one at a room temperature to 200° C., for example. The room temperature is 25° C., for example. Young's modulus can be measured by a known method by using, for example, a tensile tester (an AG-Is type autograph precision universal testing machine manufactured by Shimadzu Co., Ltd.). It is preferable that the second supporting medium has a Young's modulus as high as possible, and out of supporting mediums that are used to form the molded article by curing a resin composition on the surface, a supporting medium having, as high Young's modulus, a Young's modulus of about 230 GPa is generally known. Therefore, it is general that an upper limit value of Young's modulus is about 230 GPa. That is, it is preferable that Young's modulus of the second supporting medium is 20 GPa to 230 GPa. When Young's modulus of the second supporting medium is within the above range, it is considered possible to more suppress the occurrence of warpage and the like in the molded article forming process, although depending on the influence of hardness of the molded article itself. Further, carrying performance can be also sufficiently increased.

The second base material 121 and the second adhesive layer 122 are not particularly limited, so far as the second base material 121 and the second adhesive layer 122 can become the second supporting medium 12. A thickness and a material of the second base material 121 are not limited, so far as the base material satisfies hardness of the second supporting substrate. A coefficient of thermal expansion of the second base material 121 of the second supporting medium 12 is preferably lower to suppress warpage at the time of forming the molded article. Specifically, the coefficient of thermal expansion of the second base material is preferably $40 \times 10^{-6}/°$ C. or below, more preferably $30 \times 10^{-6}/°$ C. or below, and most preferably $20 \times 10^{-6}/°$ C. or below, as an average coefficient of thermal expansion at room temperature to 200° C. While the coefficient of thermal expansion of the second base material is preferably lower, as described above, out of base materials of the supporting medium that are used to obtain the molded article by curing the resin composition on the surface, a base material having an average coefficient of thermal expansion of about $0.5 \times 10^{-6}/°$ C. at room temperature to 200° C. is generally known as a low coefficient of thermal expansion. Therefore, it is general that a lower limit value of the average coefficient of thermal expansion at room temperature to 200° C. is about $0.5 \times 10^{-6}/°$ C. That is, it is preferable that the coefficient of thermal expansion of the second base material is $0.5 \times 10^{-6}/°$ C. to $40 \times 10^{-6}/°$ C. as the average coefficient of thermal expansion at room temperature to 200° C. When the coefficient of thermal expansion of the second base material is within the above range, it is considered possible to sufficiently suppress the occurrence of warpage and the like at the time of forming the molded article, although depending on hardness and the like of the molded article itself. The average coefficient of thermal expansion can be measured by a known method, and can be measured by using a differential thermal dilatomter, for example. As the second base material 121, there are a glass sheet and a stainless steel sheet (a SUS sheet), for example. A thickness of the second base material 121 is not particularly limited, and is preferably 0.5 mm to 3 mm, for example. A thickness and a material of the second adhesive layer 122 are not particularly limited, so far as the first supporting medium 11 can be adhered to the surface of the second adhesive layer 122. As the second adhesive layer 122, there is a layer made of an adhesive, for example. The adhesive is not particularly limited, so far as the first supporting medium can be peeled while maintaining adhesiveness with the first supporting medium, after the curing. As the adhesive of the second adhesive layer 122, there are a silicone adhesive, an acrylic adhesive, a rubber adhesive, and a urethane adhesive, for example. Among these adhesives, the silicone adhesive and the acrylic adhesive are preferable, from the viewpoint of heat resistance. A heat resistance temperature of the adhesive is preferably 150° C. or above, more preferably 175° C. or above, and most preferably 200° C. or above. The heat resistance temperature in this case means a temperature at which appearance abnormality such as wrinkling, foaming, and discoloration does not occur in the appearance test after the base material coated with an adhesive (an adhesive-coated film) is left for 30 minutes in a dryer that is set at a predetermined temperature. As the adhesive of the second adhesive layer 122, an ultraviolet curing type and a pressure sensitive type can be used, and the pressure sensitive type is preferable from the viewpoint of process simplification. Further, the second adhesive layer 122 is preferably a layer that has a space into which an abutment tool can be inserted at the time of peeling the second supporting medium from the first supporting medium, in the later process.

A method of laminating the first supporting medium 11 on the second supporting medium 12 is not particularly limited. For example, there is a method of laminating by using a vacuum laminator.

Figure 1C:
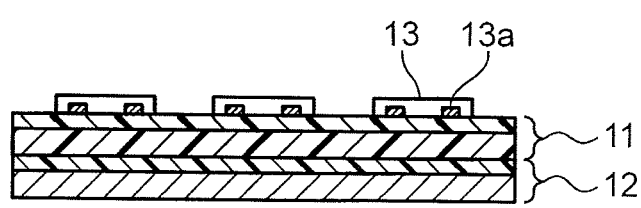

Next, as shown in FIG. 1C, semiconductor chips 13 are mounted on the first supporting medium 11 of the laminated supporting medium. At this time, the semiconductor chips 13 are mounted so that electrodes 13a of the semiconductor chips 13 are in contact with the first supporting medium 11. One or a plurality of semiconductor chips 13 may be mounted on the first supporting medium 11. According to the manufacturing method of the present embodiment, because molding bodies of a relatively large area can be suitably manufactured, a plurality of semiconductor packages can be simultaneously manufactured by mounting a plurality of molding bodies. Further, semiconductor packages that contain a plurality of semiconductor chips can be manufactured.

Figure 1D:
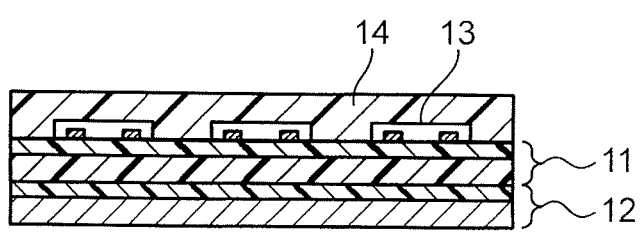

Next, as shown in FIG. 1D (FIG. 2A), the semiconductor chips 13 are covered with a resin composition, and thereafter, the resin composition is cured to form a molded article 14. That is, the surface of the first supporting medium 11 on which the semiconductor chips 13 are mounted is covered with the resin composition, and the resin composition is cured to form the molded article 14. This process corresponds to the molded article forming process. The resin composition is not particularly limited, so far as the resin composition can be formed as the molded article after being cured. As the resin composition, there is a resin composition that is used as a sealing material of a semiconductor chip. While the resin composition may be a liquid resin composition or a sheet resin composition, the sheet resin composition is preferable from the viewpoint of obtaining a molded article having a large area. The resin composition may be a thermosetting resin composition or an ultraviolet curing resin composition.

Figure 2A:
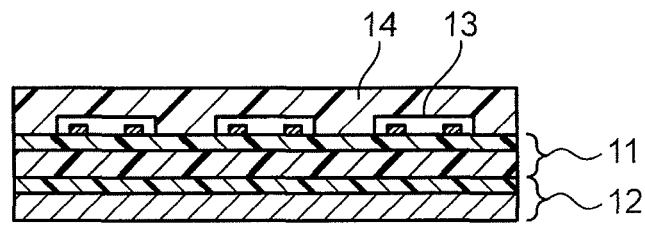
FIGS. 2A to 2D are views (part two) for explaining the example of a manufacturing method of a molded article according to the embodiment of the present invention.
Figure 2B:
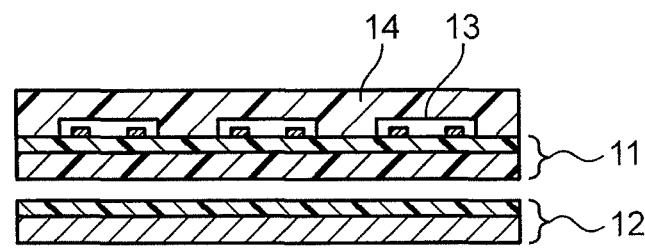

Next, as shown in FIG. 2B, after the molded article forming process, the second supporting medium 12 is peeled from the first supporting medium 11. This process corresponds to the second-supporting medium peeling process. The method of peeling the second supporting medium is not particularly limited, so far as the second supporting medium can be peeled from the first supporting medium. Specifically, there is a method of peeling the second supporting medium by inserting an abutment tool such as a cutter into between the second supporting medium and the first supporting medium. Regardless of a peeling method, what is in contact with the second supporting medium is the first supporting medium. Therefore, even when the first supporting medium is damaged, damaging the molded article can be suppressed.

Figure 2C:
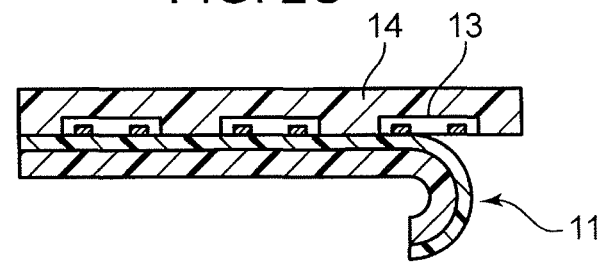

Next, as shown in FIG. 2C, the first supporting medium 11 is peeled from the molded article 14 that contains the semiconductor chips 13, while bending the first supporting medium 11. This process corresponds to the first-supporting medium peeling process. Because the first supporting medium is peeled while being bent in this way, the peeling is like peeling off a seal, and the occurrence of a damage to the molded article 14 can be suppressed.

Figure 2D:
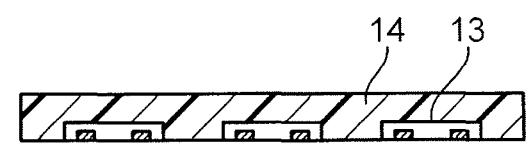

From the above, as shown in FIG. 2D, even in the case of manufacturing a molded article having a large area, the molded article 14 in a desired shape can be manufactured. According to the manufacturing method like this, as shown in FIG. 2D, a semiconductor package as the molded article 14 that contains the semiconductor chips 13 can be manufactured. According to this manufacturing method, as a resin composition that is used in the molded article forming process, a molded article having a large area can be manufactured by using the sheet resin composition. Further, a semiconductor package of a size that cannot be manufactured by the conventional method of manufacturing a semiconductor package can be manufactured. For example, a large molded article of a size 600 mm×510 mm in the process of a printed wiring board can be obtained.

A manufacturing method in the case of not laminating two kinds of supporting bodies as compared with the above manufacturing method will be described with reference to FIGS. 3A to 3D. FIGS. 3A to 3D show an example of a manufacturing method of a molded article for explaining a comparison with the embodiment of the present invention.

Figure 3A:
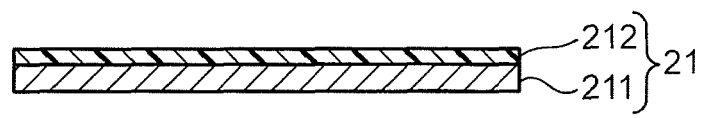
FIGS. 3A to 3D are views showing an example of a manufacturing method of a molded article for explaining a comparison with the embodiment of the present invention.
Figure 3B:
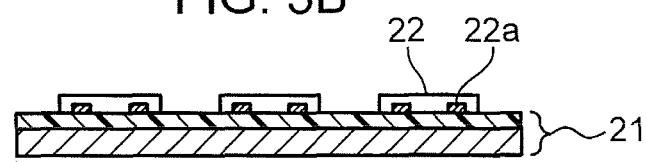
Figure 3C:
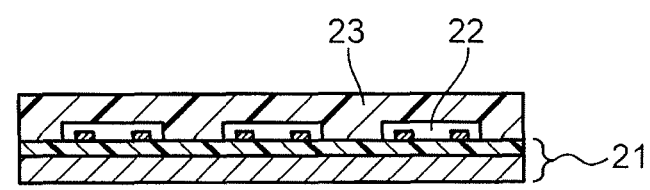
Figure 3D:
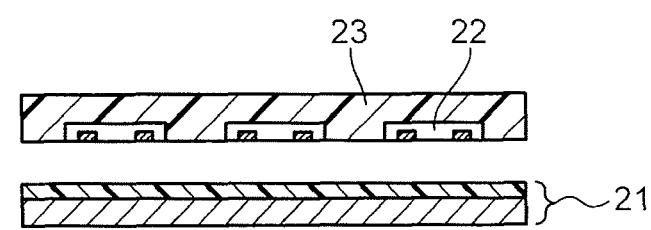

First, as shown in FIG. 3A, a supporting medium 21 that includes an adhesive layer 212 on the surface of a base material 211 is prepared. Then, as shown in FIG. 3B, semiconductor chips 22 are mounted on the adhesive layer 212 of the supporting medium 21. Thereafter, a molded article 23 that contains the semiconductor chips 22 is formed as shown in FIG. 3C. A forming method of the molded article 23 may be similar to the above molded article forming process. Next, as shown in FIG. 3D, the supporting medium 21 is peeled from the molded article 23. With this arrangement, a semiconductor package as the molded article 23 that contains the semiconductor chips 22 can be manufactured.

In the case of the above manufacturing method, first, when a flexible supporting medium is used as the supporting medium 21, there is a case where shape abnormality such as warpage of a molded article cannot be sufficiently suppressed due to flexure of the supporting medium 21 at the molded article forming time.

When a rigid supporting medium is used as the supporting medium 21, at the time of peeling the supporting medium 21 from the molded article 23, there is a high possibility of damaging the molded article 23, and the obtained molded article 23 is broken in some cases. Even when a rigid supporting medium is used as the supporting medium 21, there is considered a case of using the supporting medium 21 of which the adhesive layer 212 is a layer made of a temperature sensitive adhesive that loses adhesion performance at or above a predetermined temperature. In such a case, there is considered a case of heating the supporting medium at the peeling time, and peeling after lowering the adhesion performance of the adhesive layer 212. With this arrangement, the occurrence of a damage to the molded article can be suppressed in some cases. However, actually, at the time of the molded article forming process, the adhesion performance of the adhesive layer 212 is lowered, and a suitable molded article cannot be obtained in some cases. In order to prevent this situation, at the time of the molded article forming process, the resin composition needs to be cured at a temperature at which the adhesion performance of the adhesive layer 212 is not lowered. As a result, a material of the resin composition for obtaining a molded article is limited.

Based on the above, according to the manufacturing method of the present embodiment, even in the case of manufacturing a molded article having a large area, a molded article in a desired shape can be manufactured. According to the manufacturing method of the present embodiment, there are a few limitations to selection of a material to be used, and the manufacturing can be executed by using various materials.

Next, a manufacturing method of a semiconductor package using a molded article obtained by the manufacturing method according to the present embodiment will be described.

A molded article mounted with elements such as semiconductor chips and electronic parts that is obtained by the manufacturing method according to the present embodiment can be used for various manufacturing methods of a semiconductor package, for example.

For example, there is a method of embedding elements such as semiconductor chips and electronic parts by using a resin composition by mounting the elements such as semiconductor chips and electronic parts so that non-electrode surfaces of the elements are in contact with a laminated supporting medium. This manufacturing method includes a case of forming an insulation layer in a thickness necessary to form a circuit pattern simultaneously with embedding of the elements, and a case of forming an insulation layer for forming a circuit pattern after embedding the elements so that the circuit surfaces of the elements are slightly embedded or so that the circuit surfaces are exposed. On the other hand, there is a method of mounting elements such as semiconductor chips and electronic parts so that electrode surfaces of the elements are in contact with a laminated supporting medium, embedding the elements by using a resin composition, obtaining a molding containing semiconductor chips by curing, and thereafter forming a circuit pattern by forming an insulation resin layer at an electrode surface side of the semiconductor chips. In both cases, in order to form a circuit pattern, there is used a known circuit forming technique such as exposure and development that is used to form a circuit of a printed wiring board and a semiconductor.

Among others, it is preferable to manufacture a semiconductor package by mounting the semiconductor chips and the like on the laminated supporting medium so that electrode surfaces of the semiconductor chips are in contact with the laminated supporting medium, and by forming the insulation resin layer and forming a circuit, on the main surface of the molded article from which the first supporting medium has been peeled.

This is because the main surface of the molded article that contains the electrode surfaces of the semiconductor chips is formed flat, the inplane insulation resin layer thickness can be formed uniform and circuit pattern forming failures at the time of forming the circuit pattern can be reduced.

As a preferred embodiment of a manufacturing method of a semiconductor package, there is a manufacturing method of a semiconductor package including: an insulation resin layer forming process of forming an insulation resin layer on a surface of a molded article that is peeled from a first supporting medium; a covering film forming process of forming a resin covering film made of an insulation resin on the insulation resin layer; and a circuit pattern forming process of forming a circuit pattern on the insulation resin layer (the resin covering film).

Preferably, the circuit pattern forming process includes: a circuit groove forming process of forming a circuit groove by performing a laser processing or a machine processing to the insulation resin layer; and a conductive layer forming process of forming a conductive layer by plating the circuit groove. By forming the circuit groove by the laser processing, even when a positional deviation of an individual semiconductor chip or an electronic part occurred in the curing process of a resin composition, it is possible to align the individual semiconductor chip or the electronic part with the circuit groove to be formed. Because circuits are embedded in the insulation layer, it is easy to keep insulation from an adjacent circuit, and in the case of further laminating an insulation layer, smoothness of the entire semiconductor package can be improved.

More specifically, it is preferable that the manufacturing method of a semiconductor package includes, for example:

an insulation resin layer forming process of forming an insulation resin layer on a surface of a molded article (a molded article obtained by covering a semiconductor element with a resin composition and by (heating) curing the resin composition) that is peeled from the first supporting medium;

a covering film forming process of forming a resin covering film made of an insulation resin on the insulation resin layer;

a circuit pattern portion forming process of forming a circuit pattern portion that includes a circuit groove in a desired shape and a desired depth, by performing a laser processing or a machine processing to the covering insulation layer from an outer surface side of the resin covering film;

a catalyst forming process of forming a plating catalyst or a precursor of the plating catalyst, on a surface of the circuit pattern portion and a surface of the resin covering film;

a covering film peeling process of peeling the resin covering film from the coated insulation layer; and a plating processing of forming a circuit that is electrically connected to the electrode, by performing electroless plating to the covering insulation layer from which the resin covering film has been peeled.

FIGS. 4A to 4D are schematic sectional views for explaining each process of a manufacturing method of a semiconductor package according to one embodiment.

First, there is used a molded article in which a covering insulation layer is formed to cover semiconductor elements 411 having electrodes 411*a* on the main surface, the molded article being obtained by the above manufacturing method. Specifically, as shown in FIG. 4A, the molded article is configured to include a first insulation layer 412 and a second insulation layer 413.

Next, as shown in FIG. 4B, a resin covering film 414 is formed on the surface of the covering insulation layer at electrode 411*a* sides of the semiconductor elements 411. The surface of the covering insulation layer at electrode 411*a* sides of the semiconductor elements 411 is the surface of the second insulation layer 413 that covers the electrodes 411*a* of the semiconductor elements 411. This process corresponds to the covering film forming process.

Next, as shown in FIG. 4C, circuit pattern portions 415 that include recess portions 415*a* which reach surfaces of the electrodes 411*a* and circuit grooves 415*b* in a desired shape and a desired depth are formed, by performing a laser processing or a machine processing from an outer surface side of the resin covering film 414 to the second insulation layer 413 of the covering insulation layer. As a part of each circuit groove 415*b*, a through-hole or a recess portion for forming a land portion to secure electrical connection with other electronic part may be formed. By the circuit pattern portion 415, portions where electroless plating films are formed by electroless plating, that is, portions where electric circuits are formed are defined. Further, a laser processing or a machine processing for forming the recess portions 415*a* is a drilling processing of exposing the electrodes 411*a*. In a laser processing or a machine processing for forming the circuit grooves 415*b*, cutting is performed from an outer surface of the resin covering film 414 to the depth over the thickness of the resin covering film 414. This process corresponds to the circuit pattern portion forming process.

As shown in FIG. 4D, a plating catalyst or a precursor 416 of the plating catalyst is coated on the surfaces of the circuit pattern portions 415 and on the surfaces of the resin covering films 414 on which the circuit pattern portions 415 have not been formed. This process corresponds to the catalyst coating process.

Next, as shown in FIG. 4E, the resin covering films 414 that remain after forming the circuit pattern portions 415 are peeled from the covering insulation layer, specifically, from the surface of the second insulation layer 413 that covers the electrodes 411*a* of the semiconductor elements 411. With this arrangement, the plating catalyst or the precursor 416 of the plating catalyst can be left, on only the circuit pattern portions 415 of the second insulation layer 413. That is, in the recess portions 415*a*, the plating catalyst or a precursor 416*a* of the plating catalyst that corresponds to the positions of the recess portions 415*a* can be arranged to remain, and in the circuit grooves 415*b*, the plating catalyst or a precursor 416*b* of the plating catalyst that corresponds to the positions of the circuit grooves 415*b* can be arranged to remain. On the other hand, the plating catalyst or the precursor that is coated on the surface of the resin covering film 414 is removed together with the resin covering film 414, in a state of being held on the resin covering film 414. This process corresponds to the covering film peeling process.

Next, electroless plating is performed on the second insulation layer 413 from which the resin covering film 414 has been peeled. With this arrangement, electroless plating is formed on only the portion where the plating catalyst or the precursor 416 of the plating catalyst remains. That is, as shown in FIG. 4F, electroless plating films 417a corresponding to the positions of the recess portions 415a are formed, and electroless plating films 417b corresponding to the positions of the circuit grooves 415b are formed. This process corresponds to the plating processing process.

The electroless plating films 417b corresponding to the positions of the circuit grooves 415b formed by this electroless plating may directly become electric circuits. Alternatively, the electroless plating films 417b may directly become electric circuits. In this case, further electroless plating (fill-up plating) may be performed to provide electric circuits.

A thickness of the electroless plating film 417b is not particularly limited. Specifically, the electroless plating films 417b may be formed so that the surfaces of the electroless plating films 417b are higher than the surfaces of the second insulation layer 413, as shown in FIG. 4F, or so that the surfaces of the electroless plating films 417b are the same as or lower than the surfaces of the second insulation layer 413.

The electroless plating films 417a corresponding to the positions of the recess portions 415a formed by this electroless plating may become vias that secure an electric connection between the electroless plating films 417b and the electrodes 411a of the semiconductor elements 411, or may not directly become vias. When the electroless plating films 417a cannot directly become vias, further electroless plating (fill-up plating) may be performed to provide vias.

According to the manufacturing method like this, it is possible to highly precisely perform forming of the circuits 417b on the second insulation layers 413 (the covering insulation layer) that cover the semiconductor elements 411, and forming of the vias for electrically connecting between the circuits 417b and the electrodes 411a of the semiconductor elements 411.

The manufacturing method of a semiconductor package according to the present embodiment is for forming rewiring circuits in one layer, as shown in FIGS. 4A to 4G, or two or more layers. Specifically, as shown in FIG. 4F, after forming the electric circuits, rewiring circuits may be formed in two or more layers, by performing each of the above processes.

Last, after forming the vias 417a and the circuits 417b, as shown in FIG. 4G, insulation layers 418 may be separately formed on the second insulation layer 413, to cover the vias 417a and the circuits 417b. Then, in the insulation layer 418, recess portions that reach the circuits 417b may be formed, and, in the recess portions, there may be formed other electronic parts, and bumps 419 for securing electric connections between the circuits of the semiconductor package and circuits of the other wiring layers. When two or more semiconductor elements 411 are present, semiconductor packages may be obtained by disconnecting adjacent semiconductor elements. The semiconductor packages obtained by this disconnection may have each one semiconductor element 411, as shown in FIG. 4G, but are not limited to this. For example, each semiconductor package may include two or more semiconductor elements. When each semiconductor package includes two or more semiconductor elements, these semiconductor elements may be semiconductor elements having the same kind of function, or may be semiconductor elements having different kinds of functions.

By forming a wiring layer that is electrically connected to the circuit of the semiconductor package, on the semiconductor package, what is called a multilayer-structured semiconductor device can be obtained. That is, there can be obtained a semiconductor device that includes a semiconductor package and that has one or more wiring layers each wiring layer having circuits which are electrically connected to the semiconductor package.

Preferably, as shown in FIG. 4F, on the surface of the covering insulation layer, each circuit 417b is formed to extend to outside of an outer edge of a projected shape of the semiconductor element 411 in a direction orthogonal with the main surface of the semiconductor element 411. That is, preferably, the circuit 417b is formed widely with a width exceeding the width of the semiconductor element 411. With this arrangement, an electric connection with other electronic part can be easily secured, and an electric connection with a circuit of the wiring layer can be easily secured when manufacturing a multilayer-structured semiconductor device. Further, the obtained semiconductor package can have an increased number of output and input terminals.

The present specification discloses various modes of techniques, as described above, main techniques of which will be summarized below.

A manufacturing method of a molded article according to one aspect of the present invention includes: forming a molded article by curing a resin composition on a main surface, on a side of a bendable first supporting medium, of a laminated supporting medium obtained by laminating the first supporting medium and a second supporting medium that is harder than the first supporting medium; peeling the second supporting medium from the first supporting medium after the molded article forming step; and peeling the first supporting medium from the molded article while bending the first supporting medium after peeling the second-supporting medium.

According to such a configuration, it is possible to provide a manufacturing method of a molded article capable of manufacturing a molded article in a desired shape, even in the case of manufacturing a molded article having a large area.

This is considered due to the following.

First, in the molded article forming process, the molded article can be formed by curing the resin composition on the laminated supporting medium which includes the laminated second supporting medium. Because the laminated supporting medium includes the laminated second supporting medium that is harder than the bendable first supporting medium, the laminated supporting medium is less bendable than the supporting medium made of the bendable first supporting medium. From these facts, at the time of curing the resin composition, it is considered possible to suppress the occurrence of warpage and to manufacture a molded article in a desired shape, by curing on the laminated supporting medium rather than curing on the supporting medium made of the bendable first supporting medium.

Next, in the second-supporting medium peeling process, the second supporting medium is peeled from the first supporting medium. Because the second supporting medium is relatively hard, there is a risk of damaging a mating material, such as hurting the mating material at the peeling time. In this case, the mating material is not the molded article but is the first supporting medium. Therefore, even when the mating material is damaged at the time of peeling the second supporting medium, what is damaged is the first supporting medium, and it is considered possible to sufficiently suppress the occurrence of a damage to the molded article. Further, in the second-supporting medium peeling process, a damage that can occur at the peeling time is considered to occur in the first supporting medium, as described above. Therefore, even when the area in which the mating material is likely to be damaged is large, it is considered possible to sufficiently suppress the damage to the molded article.

Thereafter, in the first-supporting medium peeling process, the first supporting medium is peeled while bending the first supporting medium. Because the peeling is performed while bending the first supporting medium, the peeling is considered to be performed while reducing the load applied to the molded article. Therefore, it is considered possible to sufficiently suppress the occurrence of a damage to the molded article due to the peeling of the first supporting medium. Further, because the peeling in the first-supporting medium peeling process is performed while reducing the load applied to the molded article, it is considered possible to sufficiently exert the effect even when manufacturing a molded article having a large area. That is, even when manufacturing a molded article having a large area, it is considered possible to sufficiently suppress the occurrence of a damage to the molded article due to the peeling of the first supporting medium.

As the first supporting medium, there is used a supporting medium that is bendable and that can maintain a shape at a curing temperature for curing the resin composition in the molded article forming process. Therefore, although the bendable supporting medium tends to be deformed by heat and the like, by using the first supporting medium, it is considered possible to sufficiently suppress the occurrence of shape abnormality in the molded article due to the deformation of the first supporting medium at the curing time of the resin composition.

Based on the above, it is possible to provide a manufacturing method of a molded article capable of manufacturing a molded article in a desired shape even when manufacturing a molded article having a large area.

In the manufacturing method of a molded article, preferably, the molded article forming process includes mounting semiconductor chips on the main surface of the laminated supporting medium, covering the semiconductor chips with the resin composition, and curing the resin composition.

According to a configuration like this, a molded article that contains semiconductor chips can be formed in a desired shape. That is, a semiconductor chip can be suitably manufactured.

In the manufacturing method of a molded article, it is preferable that the first supporting medium includes a first base material, and a first adhesive layer that is formed on the first base material, and that the first adhesive layer has weaker adhesion strength to the molded article than adhesion strength to the first base material.

According to this configuration, a molded article in a more suitable shape can be manufactured. This is considered due to the following reasons. First, in the second-supporting medium peeling process, due to the first adhesive layer of the first supporting medium, it is considered possible to peel the second supporting medium from the first supporting medium while suitably holding the molded article on the laminated supporting medium. In the first-supporting medium peeling process, because the adhesion strength to the molded article is weaker than the adhesion strength to the first base material, the first supporting medium can be easily peeled from the molded article. At the time of peeling the first supporting medium from the molded article, the first supporting medium can be peeled in a state that the first adhesive layer is kept formed at a first base material side of the first supporting medium, and movement of the first adhesive layer to the molded article side can be sufficiently suppressed. From these facts, because the second-supporting medium peeling process and the first-supporting medium peeling process can be suitably performed, it is considered possible to manufacture a molded article in a more suitable shape.

In the first supporting medium, preferably, the first base material is a resin film having no melting point or a resin film having a melting point of 150° C. or higher.

According to this configuration, a molded article in a more suitable shape can be manufactured. This is considered due to the following reasons. The first supporting medium having the first base material like this can achieve better shape maintenance at a curing temperature at which the resin composition is cured in the molded article forming process. By using the first supporting medium like this, it is considered possible to more suppress the occurrence of shape abnormality of the molded article due to deformation of the first supporting medium at the curing time of the resin composition. Therefore, it is considered possible to manufacture a molded article in a more suitable shape.

In the manufacturing method of a molded article, it is preferable that the second supporting medium includes a second base material, and a second adhesive layer which is formed on the second base material, and that the second adhesive layer has weaker adhesion strength to the first supporting medium than adhesion strength to the second base material.

According to this configuration, a molded article in a more suitable shape can be manufactured. This is considered due to the following reasons. First, the second supporting medium can be brought into close contact with the first supporting medium, and at the time of the molded article forming process and the like, it is possible to suppress peeling and deviation of the second supporting medium from the first supporting medium. In the second-supporting medium peeling process, it is considered possible to peel the second supporting medium from the first supporting medium while suitably holding the molded article on the laminated supporting medium by the first adhesive layer of the first supporting medium. In the second-supporting medium peeling process, because the adhesion strength to the first supporting medium is weaker than the adhesion strength to the second base material, the second supporting medium can be easily peeled from the first supporting medium. At the time of peeling the second supporting medium from the first supporting medium, the second supporting medium can be peeled in a state that the second adhesive layer is kept formed at the second base material side of the second supporting medium, and it is considered possible to sufficiently suppress the movement of the second adhesive layer to the first supporting medium side. From these facts, because the second-supporting medium peeling process can be suitably performed, it is considered possible to manufacture a molded article in a more suitable shape.

In the manufacturing method of a molded article, preferably, the first supporting medium can be wound around a cylindrical body of a radius 5 mm at a winding angle of 180°.

According to this configuration, a molded article in a more suitable shape can be manufactured. This is considered because when the first supporting medium has the above flexibility, it is considered possible to suitably peel the first supporting medium while bending the first supporting medium.

In the manufacturing method of a molded article, Young's modulus of the second supporting medium is preferably 20 GPa or greater.

According to this configuration, a molded article in a more suitable shape can be manufactured. This is considered because when Young's modulus of the second supporting medium is within the above range, the occurrence of warpage and the like can be suppressed in the molded article forming process.

Hereinafter, while the present invention will be described in more detail by examples, the range of the present invention is not limited to these examples.

EXAMPLES

Example 1

By the manufacturing method shown in FIGS. 1A to 1D and 2A to 2D, a molded article (a semiconductor package) in which dummy chips were used as semiconductor chips was manufactured. Specifically, as a first supporting medium, there was used a MagiCarrier type S (manufactured by Kyosha Co., Ltd.) of 300 mm×300 mm in which a polyimide film of a thickness 50 μm was provided as a base material (a first base material), and an adhesive layer (a first adhesive layer) made of a silicone adhesive was provided on the surface of the base material. The first supporting medium is bendable. Specifically, the first supporting medium does not generate a damage such as a crease and a crack even when the first supporting medium is wound around an iron cylindrical body of a radius 5 mm at a winding angle of 180°. A melting point of the polyimide film as the first base material of the first supporting medium cannot be confirmed even when a melting point is tried to be measured by the DSC.

As a second supporting medium, there was used a MagiCarrier type S (manufactured by Kyosha Co., Ltd.) of 300 mm×300 mm in which a SUS sheet of a thickness 1 mm was provided as a base material (a second base material), and an adhesive layer (a second adhesive layer) made of a silicone adhesive was provided on the surface of the base material. The second supporting medium is harder than the first supporting medium, and has Young's modulus 193 GPa at room temperature to 200° C.

After the base material side of the first supporting medium was superposed on the adhesive layer of the second supporting medium, the first supporting medium was bonded to the second supporting medium by using a vacuum laminator. Dummy chips of a thickness 300 μm were mounted at constant intervals to form a matrix, on the first supporting medium of the laminated supporting medium obtained by bonding the first supporting medium to the second supporting medium. A sheet resin composition was covered on the whole surface of the first supporting medium at the dummy-chip mounted side, and the first supporting medium was bonded to the sheet resin composition by using a vacuum laminator. As the resin composition, a sheet sealing material (CV2306 manufactured by Panasonic Corporation) was used. Thereafter, the resin composition was cured by a hot air dryer under the condition of a curing temperature 175° C. for 30 minutes, and a molded article that contained the dummy chips was formed. The occurrence of warpage was not confirmed in the molded article obtained at this time. The first supporting medium and the second supporting medium can maintain a shape at this curing temperature.

Then, a cutter was inserted into between the second supporting medium and the first supporting medium, and the second supporting medium was peeled from the first supporting medium. Thereafter, the first supporting medium was peeled from the molded article, while manually bending the first supporting medium. By the peeling of the second supporting medium and the peeling of the first supporting medium, the molded article was neither cracked nor damaged.

Then, a warpage amount of the obtained molded article was measured. Specifically, the obtained molded article was mounted on a flat sheet, and a maximum distance between the molded article and the flat sheet in this state was measured as the warpage amount. As a result, the warpage amount was 1 mm. Further, as a result of a visual check of the obtained molded article, there was no residue of the adhesive in the obtained molded article.

In Example 1, a molded article was manufactured in a similar manner, except that the dummy chips were not used. In this case, peel strength at 90° at the time of peeling the first supporting medium was measured by using a tensile strength tester. As a result, the peel strength at 90° was 0.5 kN/m. From this, it is clear that the first supporting medium can be peeled without applying a large load to the molded article.

Example 2

Example 2 is similar to Example 1, except that the first supporting substance was changed to the following.

As a first supporting medium, there was used a heat resistance re-detachment sheet for processing (PET75-H120 (15) manufactured by Nichiei Kakoh Co., Ltd.) of 300 mm×300 mm in which a PET film of a thickness 75 μm was provided as a base material (a first base material), and an adhesive layer (a first adhesive layer) made of an acrylic adhesive was provided on the surface of the base material. The first supporting medium is bendable. Specifically, the first supporting medium does not generate a damage such as a crease and a crack even when the first supporting medium is wound around an iron cylindrical body of a radius 5 mm at a winding angle of 180°. A melting point of the PET film as the first base material of the first supporting medium was measured as 260° C. by the DSC. A shape of the first supporting medium can be maintained at the curing temperature of the resin composition.

The occurrence of warpage was not confirmed in the molded article obtained at this time. As a result of a visual check of the obtained molded article, there was no residue of the adhesive in the obtained molded article. Further, by the peeling of the second supporting medium and the peeling of the first supporting medium, the molded article was neither cracked nor damaged.

A warpage amount of the obtained molded article was measured by the above method. As a result, the warpage amount was 0 mm.

In Example 2, a molded article was manufactured in a similar manner, except that the dummy chips were not used. In this case, peel strength at 90° at the time of peeling the first supporting medium was measured by using a tensile strength tester. As a result, the peel strength at 90° was 0.2 kN/m. From this, it is clear that the first supporting medium can be peeled without applying a large load to the molded article.

Comparative Example 1

Comparative example 1 is similar to Example 1, except that the first supporting substance was changed to the following.

As a first supporting medium, there was used a background film (SB-228LBP-CH8-PB2 manufactured by Mitsui Chemicals Tohcello, Inc.) of 300 mm×300 mm in which a film made of polyester and ethylene vinyl acetate (EVA) of a thickness 145 μm was provided as a base material (a first base material), and an adhesive layer (a first adhesive layer) made of an acrylic adhesive was provided on the surface of the base material. The first supporting medium is bendable. Specifically, the first supporting medium does not generate a damage such as a crease and a crack even when the first supporting medium is wound around an iron cylindrical body of a radius 5 mm at a winding angle of 180°. A shape of the first supporting medium cannot be maintained at the curing temperature of the resin composition.

As a result of a visual check of the obtained molded article, there was a wrinkle or the like due to thermal deformation of the first supporting medium on the surface of the molded article.

Comparative Example 2

By the manufacturing method shown in FIGS. 3A to 3D, a molded article (a semiconductor package) in which dummy chips were used as semiconductor chips was manufactured. Specifically, as a supporting medium, the first supporting medium used in Example 1 was used.

Dummy chips of a thickness 300 μm were mounted at constant intervals to form a matrix, on the supporting medium. A sheet resin composition was covered on the whole surface of the supporting medium at the dummy-chip mounted side, and the supporting medium was bonded to the sheet resin composition by using a vacuum laminator. As the resin composition, a sheet sealing material (CV2306 manufactured by Panasonic Corporation) was used. Thereafter, the resin composition was cured by a hot air dryer under the condition of a curing temperature 175° C. for 30 minutes, and a molded article that contained the dummy chips was formed. The occurrence of warpage was confirmed in the molded article obtained at this time.

The supporting substance was peeled from the molded article while manually bending the supporting medium. By the peeling of the supporting medium, the molded article was neither cracked nor damaged.

A warpage amount of the obtained molded article was measured by the above method. As a result, the warpage amount was 55 mm.

From the above, when only the first supporting medium is used as the supporting medium without using the second supporting medium, it is clear that the warpage amount becomes large.

Comparative Example 3

By the manufacturing method shown in FIGS. 3A to 3D, a molded article (a semiconductor package) in which dummy chips were used as semiconductor chips was manufactured. Specifically, as a supporting medium, the second supporting medium used in Example 1 was used.

Dummy chips of a thickness 300 μm were mounted at constant intervals to form a matrix, on the supporting medium. A sheet resin composition was covered on the whole surface of the supporting medium at the dummy-chip mounted side, and the supporting medium was bonded to the sheet resin composition by using a vacuum laminator. As the resin composition, a sheet sealing material (CV2306 manufactured by Panasonic Corporation) was used. Thereafter, the resin composition was cured by a hot air dryer under the condition of a curing temperature 175° C. for 30 minutes, and a molded article that contained the dummy chips was formed. The occurrence of warpage was not confirmed in the molded article obtained at this time.

A cutter was inserted into between the supporting medium and the molded article, and the supporting medium was peeled from the molded article. At this time, a load was applied to the molded article, and the molded article was cracked.

From the above, it can be understood that, when only the second supporting medium is used as the supporting medium without using the first supporting medium, a possibility of the occurrence of a damage such as a crack in the molded article during peeling of the supporting medium becomes high.

Comparative Example 4

As a first supporting medium, there was used REVALPHA (150° C. peeling type) manufactured by Nitto Denko Corporation. REVALPHA is a both-side adhesive type adhesive film, and has a heat-peel type adhesive layer and a non-peelable adhesive layer at the opposite side of the heat-peeling type adhesive layer.

As a second supporting medium, a SUS sheet of a thickness 1 mm was used as a base material (a second base material). On the second supporting medium, a non-peelable adhesive layer side of the first supporting medium was superposed, and thereafter, the first supporting medium was bonded to the second supporting medium, by using a vacuum laminator. Dummy chips of a thickness 300 μm were mounted at constant intervals to form a matrix, on the first supporting medium of the laminated supporting medium obtained by bonding the first supporting medium to the second supporting medium. A sheet resin composition was covered on the whole surface of the first supporting medium at the dummy-chip mounted side, and the first supporting medium was bonded to the sheet resin composition by using a vacuum laminator. As the resin composition, a sheet sealing material (CV2306 manufactured by Panasonic Corporation) was used. Thereafter, the resin composition was cured by a hot air dryer under the condition of a curing temperature 175° C. for 30 minutes, and a molded article that contained the dummy chips was formed. The occurrence of warpage was not confirmed in the molded article obtained at this time. However, the resin composition was adhered to the adhesive layer, and it was not possible to peel the first supporting medium after the resin curing.

This is considered due to the following reasons. At the time of curing the resin composition on the adhesive layer at the heat-peeling side, because a film that was peelable at 150° C. was used, adhesion force was already reduced at the curing temperature 175° C. and the film was peelable. On the other hand, because the resin was cured at the temperature 175° C., the resin was integrally cured with the peelable film, and finally, the first supporting medium was not able to be peeled.

From the above, according to the manufacturing method of the present embodiment, it is possible to sufficiently suppress the occurrence of a damage such as a crack on the molded article, and it is also possible to sufficiently suppress the occurrence of warpage. From the above, according to the manufacturing method of the present embodiment, it has become clear that a molded article in a desired shape can be manufactured even in the case of manufacturing a molded article having a large area.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. A manufacturing method of a resin sealing molded article having a semiconductor chip, comprising:
   forming a molded article by:
      curing a resin composition on a main surface, on a side of a bendable first supporting medium, of a laminated supporting medium obtained by laminating the first supporting medium and a second supporting medium that is harder than the first supporting medium;
      mounting the semiconductor chip on the main surface of the laminated supporting medium;
      covering the semiconductor chip with the resin composition; and
      forming the resin sealing molded article having the semiconductor chip by the curing of the resin composition;
   peeling the second supporting medium from the first supporting medium after the molded article forming step; and
   peeling the first supporting medium from the molded article while bending the first supporting medium after peeling the second-supporting medium, wherein:
      the first supporting medium maintains a shape at a curing temperature at which the resin composition is cured in the forming of the molded article;
      the first supporting medium includes a first base material formed on the first supporting medium, and a first adhesive layer that is formed on the first base material, and
      the first adhesive layer has weaker adhesion strength to the molded article than adhesion strength to the first base material.

2. The manufacturing method of a resin sealing molded article according to claim 1, wherein the first base material is a resin film having no melting point or a resin film having a melting point of 150° C. or higher.

3. The manufacturing method of a resin sealing molded article according to claim 1, wherein
   the second supporting medium includes a second base material, and a second adhesive layer that is formed on the second base material, and
   the second adhesive layer has weaker adhesion strength to the first supporting medium than adhesion strength to the second base material.

4. The manufacturing method of a resin sealing molded article according to claim 1, wherein the first supporting medium can be wound around a cylindrical body of a radius 5 mm at a winding angle of 180°.

5. The manufacturing method of a resin sealing molded article according to claim 1, wherein the Young's modulus of the second supporting medium is 20 GPa or greater.

* * * * *